United States Patent
Casey et al.

(10) Patent No.: US 11,500,005 B2
(45) Date of Patent: *Nov. 15, 2022

(54) NON-CONTACT DETECTION OF ELECTRICAL ENERGY

(71) Applicant: X Development LLC, Mountain View, CA (US)

(72) Inventors: Leo Francis Casey, San Francisco, CA (US); Siyuan Xin, Los Altos, CA (US); Peter Evans, Mountain View, CA (US); Shuyu Wang, Redwood City, CA (US); Raymond Daly, Palo Alto, CA (US); C. O. Lee Boyce, Jr., Mountain View, CA (US); Joel Fraser Atwater, Danville, CA (US)

(73) Assignee: X Development LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/243,675

(22) Filed: Apr. 29, 2021

(65) Prior Publication Data

US 2021/0247433 A1    Aug. 12, 2021

Related U.S. Application Data

(63) Continuation of application No. 16/429,506, filed on Jun. 3, 2019, now Pat. No. 11,016,132.

(51) Int. Cl.
*G01R 29/18* (2006.01)
(52) U.S. Cl.
CPC .................................. *G01R 29/18* (2013.01)

(58) Field of Classification Search
CPC ......... G01R 29/18; G01R 29/00; G01R 19/00
(Continued)

(56) References Cited

U.S. PATENT DOCUMENTS

| | | |
|---|---|---|
| 7,031,859 B2 | 4/2006 | Piesinger |
| 8,283,911 B1 | 10/2012 | Bierer |

(Continued)

FOREIGN PATENT DOCUMENTS

| | | |
|---|---|---|
| EP | 2330430 | 6/2011 |
| GB | 2552791 | 2/2018 |

OTHER PUBLICATIONS

International Preliminary Report on Patentability in International Appln. No. PCT/US2020/035510, dated Dec. 16, 2021, 9 pages.

(Continued)

*Primary Examiner* — Giovanni Astacio-Oquendo
(74) *Attorney, Agent, or Firm* — Fish & Richardson P.C.

(57) ABSTRACT

Methods, systems, and apparatus, including computer programs stored on a computer-readable storage medium, for obtaining a reference phase signal that is synchronized with an alternating current (AC) phase of a multi-phase electrical power distribution system. The apparatus obtains output signals from sensors, each output signal representative of an electromagnetic emission detected by a respective sensor. The apparatus identifies, based on comparing respective phases of the output signals to the reference phase signal, a particular AC phase of the multi-phase electrical power distribution system associated with a source of the emissions. The apparatus provides an indication of the particular AC phase to a user.

23 Claims, 5 Drawing Sheets

(58) Field of Classification Search
USPC .................................... 324/86, 84, 76.11
See application file for complete search history.

(56) References Cited

U.S. PATENT DOCUMENTS

| | | | |
|---|---|---|---|
| 8,533,121 | B1 | 9/2013 | Piesinger |
| 8,570,024 | B1 | 10/2013 | Piesinger |
| 2003/0184275 | A1 | 10/2003 | Slade et al. |
| 2008/0315584 | A1 | 12/2008 | Rozman |
| 2011/0301894 | A1 | 12/2011 | Sanderford |
| 2012/0221265 | A1 | 8/2012 | Arya et al. |
| 2013/0024149 | A1 | 1/2013 | Nayar et al. |
| 2013/0051498 | A1 | 2/2013 | Taft et al. |
| 2014/0346986 | A1* | 11/2014 | Warr .................. H02J 4/00 318/400.21 |
| 2015/0002137 | A1* | 1/2015 | Patel ................ G01R 15/207 324/130 |
| 2015/0331024 | A1* | 11/2015 | Bruel ................ G01R 21/06 324/142 |
| 2016/0154051 | A1 | 6/2016 | Watson |
| 2016/0377660 | A1 | 12/2016 | Muller |
| 2017/0234945 | A1 | 8/2017 | Findeklee |
| 2018/0254727 | A1 | 9/2018 | Ren |
| 2019/0049493 | A1 | 2/2019 | Dent |
| 2020/0379025 | A1 | 12/2020 | Casey et al. |
| 2022/0149611 | A1* | 5/2022 | Madonna .............. H02H 1/0007 |
| 2022/0187347 | A1* | 6/2022 | Sargsyan .............. G01R 15/142 |
| 2022/0214406 | A1* | 7/2022 | Rudloff ................ H02M 1/36 |

OTHER PUBLICATIONS

Alphenaar, "Wireless Sensor Network for Electric Transmission Line Monitoring," Department of Electrical and Computer Engineering, University of Louisville, Aug. 2017, 33 pages.
http://lindsey-usa.com [online], "GEN2 Post Insulator Sensors," Jan. 2019, retrieved on Jan. 12, 2021, retrieved from URL<http://lindsey-usa.com/wp-content/uploads/2019/01/09B-002-GEN2-January-2019.pdf/>, 4 pages.
http://lindsey-usa.com [online], "TLM Conductor Monitor," Mar. 2017, retrieved on Jan. 12, 2021, retrieved from URL<http://lindsey-usa.com/wp-content/uploads/2017/03/11F-001-TLM-March-2017.pdf/>, 2 pages.
https://cdn2.hubspot.net [online], "V3 Transmission Line Monitoring System," 2018, retrieved on Jan. 13, 2021, retrieved from URL<https://cdn2.hubspot.net/hubfs/4412998/LineVision%20Data%20Sheet-1018-2.pdf>, 2 pages.
https://franklingrid.com [online], "Gridsense Line IQ," Aug. 2020, retrieved on Jan. 13, 2021, retrieved from URL<https://franklingrid.com/utility-grid monitors/gridsense_transformer_line_iq/specifications/>, 3 pages.
https://heimdallpower.com [online], "Heimdall Power," Aug. 2018, retrieved on Jan. 13, 2021, retrieved from URL<https://heimdallpower.com/>, 9 pages.
https://linewatch.com/ [online], "LineWatch Medium Voltage Utility Sensros," 2020, retrieved on Jan. 12, 2021, retrieved from URL<https://linewatch.com/linewatch-medium-voltage-utility-sensors//>, 2 pages.
https://www.engerati.com [online], "Drones and robots combine for transmission line monitoring," Mar. 12, 2018, retrieved on Jan. 13, 2021, retrieved from URL<https://www.engerati.com/transmission-distribution/drones-and-robots-combine-for-transmission-line-monitoring//>, 11 pages.
https://www.gegridsolutions.com [online], "Multilin Intelligent Line Monitoring System," Nov. 2015, retrieved on Jan. 13, 2021, retrieved from URL<https://www.gegridsolutions.com/multilin/catalog/fmc.htm>, 2 pages.
https://www.inhandnetworks.com [online], "Overhead Line Sensor," 2018, retrieved on Jan. 12, 2021, retrieved from URL<https://www.inhandnetworks.com/upload/attachment/201707/27/052719/IWOS%20Overhead%20Line%20Sensor-Acquisition%20Unit_Prdt%20Spec_V1.0_InHand%20Networks.pdf/>, 7 pages.
https://www.nktphotonics.com [online], "Lios Sensing," 2017, retrieved on Jan. 12, 2021, retrieved from URL<http://web.archive.org/web/20171001000000*/https://www.nktphotonics.com/lios/en/application/overhead-transmission-line-temperature-monitoring-dynamic-rating/>, 6 pages.
https://www.sensanna.com [online], "SenSanna Exists for One Purpose," Jan. 2016, retrieved on Jan. 13, 2021, retrieved from URL<http://web.archive.org/web/20160116064258/https://www.sensanna.com/>, 2 pages.
https://www.sentient-energy.com [online], "MM3™ Intelligent Sensor," Sep. 2017, retrieved on Jan. 13, 2021, retrieved from URL<http://web.archive.org/web/20170903170342/https://www.sentient-energy.com/products/mm3-intelligent-sensor>, 2 pages.
https://www.sentient-energy.com [online], "Sentient UM3+™," 2018, retrieved on Jan. 13, 2021, retrieved from URL<https://www.sentient-energy.com/SentientPDFs/Sentient-Energy-61251-UM3-201801.pdf>, 2 pages.
PCT International Search Report and Written Opinion in International Appln. No. PCT/US2020/035510, dated Sep. 17, 2020, 15 pages.
Sanda et al., "Overhead Transmission Line Monitoring System for Dynamic Rating," Environment and Energy, Oct. 2018, 87:64-69.
www.aclara.com [online], "MV Sensor," Jun. 2017, retrieved on Jan. 13, 2021, retrieved from URL<http://web.archive.org/web/20170610111956/https://www.aclara.com/products-and-services/sensors-and-controls/grid-monitoring-platform/mv-sensor/>, 3 pages.

* cited by examiner

NON-CONTACT DETECTION OF ELECTRICAL ENERGY

CROSS REFERENCE TO RELATED APPLICATION

This patent application is a continuation (and claims the benefit of priority under 35 USC 120) of U.S. patent application Ser. No. 16/429,506, filed Jun. 3, 2019. The disclosure of the prior application is considered part of (and is incorporated by reference in) the disclosure of this application.

BACKGROUND

Electric generating power plants commonly produce three phase alternating current (AC) electrical power. The voltage of the transmitted and distributed electric power can be increased or reduced by transformers located at substations or switching yards of on feeders located between power plants and loads. The three-phase power can be distributed through an electrical grid to provide power to loads such as residential, commercial, and industrial properties. Residential homes and small businesses (e.g., retail stores) are typically fed from one phase of an electrical distribution system. In some instances, the increasing use of alternative energy sources by residential and small businesses to reduce their electrical draw from the electrical grid (and in some instances, create reverse electrical power flow to the grid) can cause, or increase, phase imbalances in regions of the electrical grid. There are other causes of phase imbalance as well, for instance the assignment of unbalanced loads to the phases within industrial facilities or along three phase feeders. Often these imbalances occur over time as loads are moved or new loads assigned. Load imbalance can have negative effects, particularly on the efficiency of three-phase transformers, and often the phase assignments of loads are not well documented.

SUMMARY

This specification relates to detecting the phases of loads in electrical distribution systems. More specifically, the disclosure relates to a non-contact phase identifier and operations of a phase identifier. A phase identifier is configured to identify the individual phase of a load in a three-phase alternating current electrical power distribution system (e.g., a three-phase AC system).

An example implementation of the phase identifier is to identify the phase of a residential home connected to an electrical grid. Residential properties and small businesses are typically connected to one phase of a three-phase electrical grid. Recently there has been an increase in the number of homes with photovoltaic solar panel systems that can provide electrical power back to the grid. Grid-connected solar panels reduce the electric load of a home, so that the home can function as both a load, and at certain times, as a source to the grid. If these homes are not connected in a balanced manner, the homes can cause phase imbalances in the grid, which decreases grid efficiency.

A three-phase electrical distribution system is most efficient when the loads on each phase are equally balanced. To aid in balancing loads on an electrical distribution system, the phase of existing loads can be identified. A phase identifier can identify the phase of loads or sources without making physical contact with power lines.

The phase identifier operates by detecting emissions from a nearby load such as a house connected to an electrical grid. Emissions can include, but are not limited to, electric fields, magnetic fields, infrared energy, ultraviolet energy, and visible light. The emissions correspond to the electrical power signals supplied to electrical loads in the home, and therefore can be used to determine which phase of an electric power distribution system is being supplied to the loads in the house. In some implementations, the phase identifier can detect and aggregate multiple types of emissions to determine which phase of the multi-phase system is supplied to the local loads (e.g., within a house).

In general, innovative aspects of the subject matter described in this specification can be embodied in an electrical phase identification device that includes sensors including a first sensor configured to detect a first type of emission and a second sensor configured to detect a second type of emission, a power source, and a control system. The control system is coupled to the sensors and the power source. The control system includes one or more processors and a data store coupled to the one or more processors. The data store has instructions stored thereon which, when executed by the one or more processors, causes the one or more processors to perform operations that include: obtaining a reference phase signal that is synchronized with an alternating current (AC) phase of a multi-phase electrical power distribution system; obtaining output signals from the sensors, each output signal representative of an electromagnetic emission detected by a respective sensor; identifying, based on comparing respective phases of the output signals to the reference phase signal, a particular AC phase of the multi-phase electrical power distribution system associated with a source of the emissions; and providing an indication of the particular AC phase to a user.

This and other implementations can each optionally include one or more of the following features.

In some implementations, obtaining the reference phase signal includes receiving a GPS clock signal that is synchronized with the AC phase of the multi-phase electrical power distribution system.

In some implementations, the operations include transmitting the indication of the particular AC phase to a server system.

In some implementations, identifying the particular AC phase of the multi-phase electrical power distribution system includes determining that the respective phases of the output signals from the first sensor and the second sensor are within an expected lagging range from the reference phase signal that is associated with the particular AC phase of the multi-phase electrical power distribution system.

In some implementations, identifying the particular AC phase of the multi-phase electrical power distribution system includes combining the output signals into a base output signal and comparing a phase of the base output signal to the reference phase signal.

In some implementations, identifying the particular AC phase of the multi-phase electrical power distribution system includes identifying one of the output signals as a dominant signal and comparing a phase of the dominant signal to the reference phase signal.

In some implementations, the power source includes a battery or a solar cell.

In some implementations, the operations include identifying one of the output signals as an outlier signal, based on a phase of the one of the output signals falling outside of an expected lagging range from the reference phase signal, and identifying the particular AC phase includes identifying the particular AC phase based on comparing respective phases of the output signals, other than the outlier signal, to the reference phase signal.

In some implementations, the first sensor is an electric field sensor, and the second sensor is one of a magnetic field sensor, an infrared sensor, a visible light sensor, or an ultraviolet light sensor.

In some implementations, the sensors, power source, and control system are enclosed in a portable housing.

In another general aspect, innovative aspects of the subject matter described in this specification can be embodied in methods that include actions of obtaining a reference phase signal that is synchronized with an AC phase of a multi-phase electrical power distribution system, obtaining output signals from two or more sensors, each output signal representative of an electromagnetic emission detected by a respective sensor, identifying, based on comparing respective phases of the output signals to the reference phase signal, a particular AC phase of the multi-phase electrical power distribution system associated with a source of the emissions, and providing an indication of the particular AC phase to a user. Other implementations of this aspect include corresponding systems, apparatus, and computer programs, configured to perform the actions of the methods, encoded on computer storage devices.

Among other advantages, implementations may improve the overall efficiency of electrical power systems, e.g., power transmission and distributions systems. For example, a phase identifier can identify a particular phase of multi-phase electrical power distribution system to aid in balancing loads. An electrical distribution system is most efficient when the loads on each phase are equally balanced. Implementations provide for non-intrusive phase identification in electrical power systems. A phase identifier does not require physical electrical connections to the electrical power systems. A phase identifier can identify the phase of loads or sources without making physical contact with power lines.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

A phase identifier is configured to identify the individual phase of a load in a three-phase alternating current electrical power distribution system (e.g., a three-phase AC system). For example, the phase identifier operates by detecting emissions from a nearby load such as a home connected to an electrical grid. Emissions can include, but are not limited to, electric fields, magnetic fields, infrared energy, ultraviolet energy, and visible light. The emissions are linked to the electrical power signals supplied to electrical loads in the home, and therefore can be used to determine which phase of a power system is being supplied to the loads in the home. In some implementations, the phase identifier detects and aggregates multiple types of emissions to determine which phase of the multi-phase system is supplied to one or more loads (e.g., houses).

An example implementation of the phase identifier is to identify the phase of a residential home, such as a house, connected to an electrical grid. Residential properties are typically connected to one phase of a grid. Recently there has been an increase in the number of homes with photovoltaic solar panel systems that can provide electrical power to the load, and back to the grid. Grid-connected solar panels reduce the electric load of a home, so that the home can function as both a load and source to the grid. This can cause phase imbalances in the grid, which decreases grid efficiency.

The application of phase shifting transformers, such as delta-star transformers, and the application of single phase transformers to line-line outputs of the secondary side, can create positive or negative 60 degree phase shifts between the primary and the secondary sides of distribution interconnection, for both voltages and currents. References to phases A, B, and C in this specification refer to the secondary side. The appropriate phase shifts can be added when referring back to the distribution primary side.

Implementations of the present disclosure will be discussed in further detail with reference to an example context, however, it should be appreciated that the implementations discussed may be applicable more generally to any load connected to a phase of an electrical grid. The example context includes a house in a residential neighborhood. It is also appreciated, however, that implementations of the present disclosure can be realized in other appropriate contexts, for example, detecting electrical phases used to power residential, retail, or commercial property. In some cases, the phase identifier can be used to identify which phase of a three-phase system a particular piece of electrical equipment is operating on, e.g., in an industrial complex such as a large factory.

Figure 1:
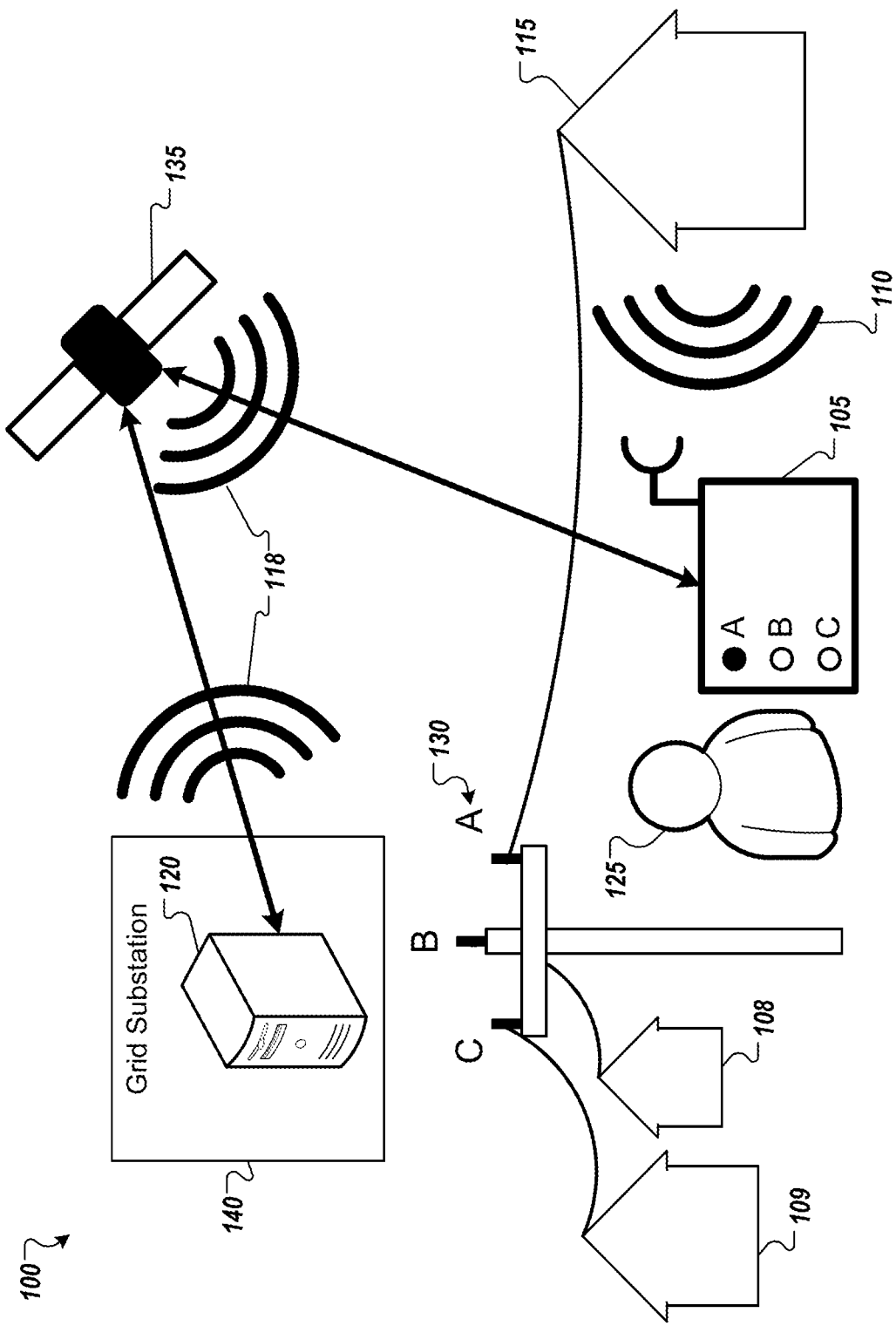
FIG. 1 is a diagram of an exemplary environment in which an electrical phase identifier can be used.

FIG. 1 is a diagram of an exemplary environment 100 in which an electrical phase identifier 105 may be used. For example, a phase identifier 105 detects emissions 110 from a house 115 connected to an electrical distribution system (e.g., a load of an electrical grid). The phase identifier 105 receives a reference signal 118. For example, the reference signal 118 is a reference timing signal which can be sent (e.g., broadcasted) from a server 120 at a grid substation 140. In some implementations, the reference signal 118 can come from a component within the phase identifier 105, such as a previously synchronized reference clock, or from any power source of known phase. The phase identifier 105 compares the detected emissions 110 with the reference signal to identify the phase 130 of the house 115. The phase identifier 105 provides indications of the specific phase 130 of the house 115 to a user 125.

In more detail, the electrical distribution system in FIG. 1 distributes three phase AC power to houses 108, 109, and 115 within a residential area. Each house acts as a load on the electrical distribution system, and each is fed from one phase of the electrical grid. For instance, houses 108 and 109 are connected to phases B and C, respectively. House 115 is connected to phase A.

A user 125 directs a phase identifier 105 towards the house 115. The phase identifier 105 can be portable, i.e., sized and shaped to enable the user 125 to carry the phase identifier 105 by hand. The sensors, power source, and control system of the phase identifier 105 can be enclosed in a portable housing. The phase identifier 105 can include an accessory structure, e.g., a handle, that permits the user 125 to transport the device by hand. In some examples, the phase identifier 105 can be mounted to a piece of equipment, e.g., a helmet or vest of the user 125. In some examples, the phase identifier 105 can be mounted to a vehicle.

The phase identifier 105 can be mounted to any type of vehicle, such as a manually operated, remotely-piloted, or autonomous vehicle. The vehicle can be ground-based or airborne. For example, a phase identifier 105 can be mounted on an autonomous ground-based vehicle. The phase identifier can use sensors such as a camera to identify loads, and can orient its detectors toward the loads.

The phase identifier 105 includes one or more detectors. The detectors of the phase identifier 105 are configured to detect emissions from electrical loads when within a detectable range and field of view. For example, the detectors can be electric field detectors, magnetic field detectors, infrared energy detectors, ultraviolet energy detectors, and visible light detectors.

The detectors of the phase identifier 105 collect emissions 110 from a house 115. For example, when a user 125 aims the detectors of the phase identifier 105 toward the house 115, the detectors receive emission 110 signals from the house 115. Emission signals received by the detectors can include, but are not limited to, electric field emissions, magnetic field emissions, infrared energy emissions, ultraviolet energy emission, and visible light emissions. The phase identifier 105 can include shielding to eliminate noise signals. For example, the shielding can block the emissions signals from houses 108 and 109.

Since the house 115 is connected to one phase of the AC grid, the phase of emissions 110 from the house 115 correlate to the specific phase 130 that feeds the house 115. Generally, emissions 110 from the house are expected to either align with or lag the specific electrical phase 130 that drives loads that create the emissions (e.g., lights, motors, compressors, etc. that are in the house). The phase identifier 105 determines which specific phase 130 the house 115 is connected to, based on the detected emissions 110. To make this determination, the phase identifier 105 compares the phase of emissions 110 detected from the house 115 to a reference signal 118.

The reference signal 118 is synchronized to a particular AC phase of the AC grid. For example, the timing of the reference phase signal can be correlated with the AC variations of one of three AC power phases at a power substation so that the reference phase signal provides an accurate representation of AC power phase. The reference signal 118 can be generated on a server 120 at a grid substation 140 or other location on the grid where the phase relationships are known.

The reference signal 118 is sent to the phase identifier 105. For example, the grid substation 140 can transmit the reference signal to a satellite 135. The phase identifier 105 then receives the reference signal from the satellite 135. For example, the server 120 at the grid substation 140 and the phase identifier 105 can include highly accurate reference clocks, such as GPS clocks. In some examples, a GPS clock signal can be synchronized to one of the phases of the AC grid and used as the reference signal. The phase identifier 105 compares the reference signal 118 to the emission 110 from the house 115 to determine which specific phase 130 the house 115 is connected to.

In the example in FIG. 1, the house 115 is connected to phase A of the electrical grid. The phase identifier 105 collects emissions 110 from the house 115. The emissions 110 can include, for example, visible light emissions. Visible light emissions generally align with the electrical phase of the power source. For example, if the power source is phase A of an electrical grid, the phase of the visible light emissions is expected to approximately align with phase A of the electrical grid.

The reference signal 118 can be synchronized with any of the three phases of AC power. If the reference signal 118 is synchronized with phase A, and the house 115 is connected to phase A, the reference signal 118 and the phase of visible light emissions are expected to approximately align. If the reference signal is synchronized with phase B, the reference signal 118 and the phase of visible light emissions will be offset by approximately 120 degrees. If the reference signal 118 is synchronized with phase C, the reference signal 118 and the phase of visible light emissions will be offset by approximately 240 degrees.

Other sources of emissions, such as magnetic field emissions, may not align with the phase of the power source, but may lag in phase by ninety degrees or less. For example, if the reference signal 118 is synchronized with phase A, and the house 115 is connected to phase A, the phase of magnetic field emissions from house 115 will lag the reference signal 118 by a phase angle less than 120 degrees. That is, although the magnetic field emissions will lag the reference phase, they generally will not lag by so much as to fall behind the phase B signals (e.g., assuming phase B lags phase A by 120 degrees). If the reference signal 118 is synchronized with phase B, the phase of magnetic field emissions from house 115 (connected to phase A) will lag the reference signal 118 by a phase angle between approximately 240 and 360 degrees. If the reference signal 118 is synchronized with phase C, the phase of magnetic field emissions from house 115 will lag the reference signal 118 by a phase angle between approximately 120 and 240 degrees.

Based on comparing the known phase of the reference signal 118 to the unknown phase of the detected emission 110, the phase identifier 105 can determine the specific phase 130 of the AC power grid that the house 115 is connected to. For example, if the reference signal 118 is synchronized with phase A, and the visible light emissions from the house 115 approximately align with the reference signal 118, the phase identifier 105 can determine that the house 115 is connected to phase A of the electrical grid. As another example, if the reference signal 118 is synchronized with phase A, and the magnetic field emissions from the house 115 are offset from the reference signal 118 by a phase angle between approximately 0 and 120 degrees, the phase identifier 105 can determine that the house is connected to phase A.

The phase identifier 105 can detect more than one type of emissions 110. For example, the phase identifier can detect both light emissions and magnetic field emissions. For example, if the light emissions approximately align with the reference signal, which is synchronized with phase A, and the magnetic field emissions are offset from the reference signal by a phase angle between approximately 0 and 120 degrees, the phase identifier 105 can aggregate the data to determine that the house is connected to phase A.

The phase identifier 105 provides indications of the specific phase 130 of the house 115 to the user 125. The indication may be, for example, a digital display screen that can display the letters "A," "B," or "C," according to the identified phase.

The phase identifier 105 can also communicate the identified phase of the house 115 back to the server 120 at the grid substation 140. The identified phases of various loads can be saved and referenced for various purposes, such as mapping the electrical distribution system, tracking phase imbalance, and/or correcting phase imbalance.

Figure 2:
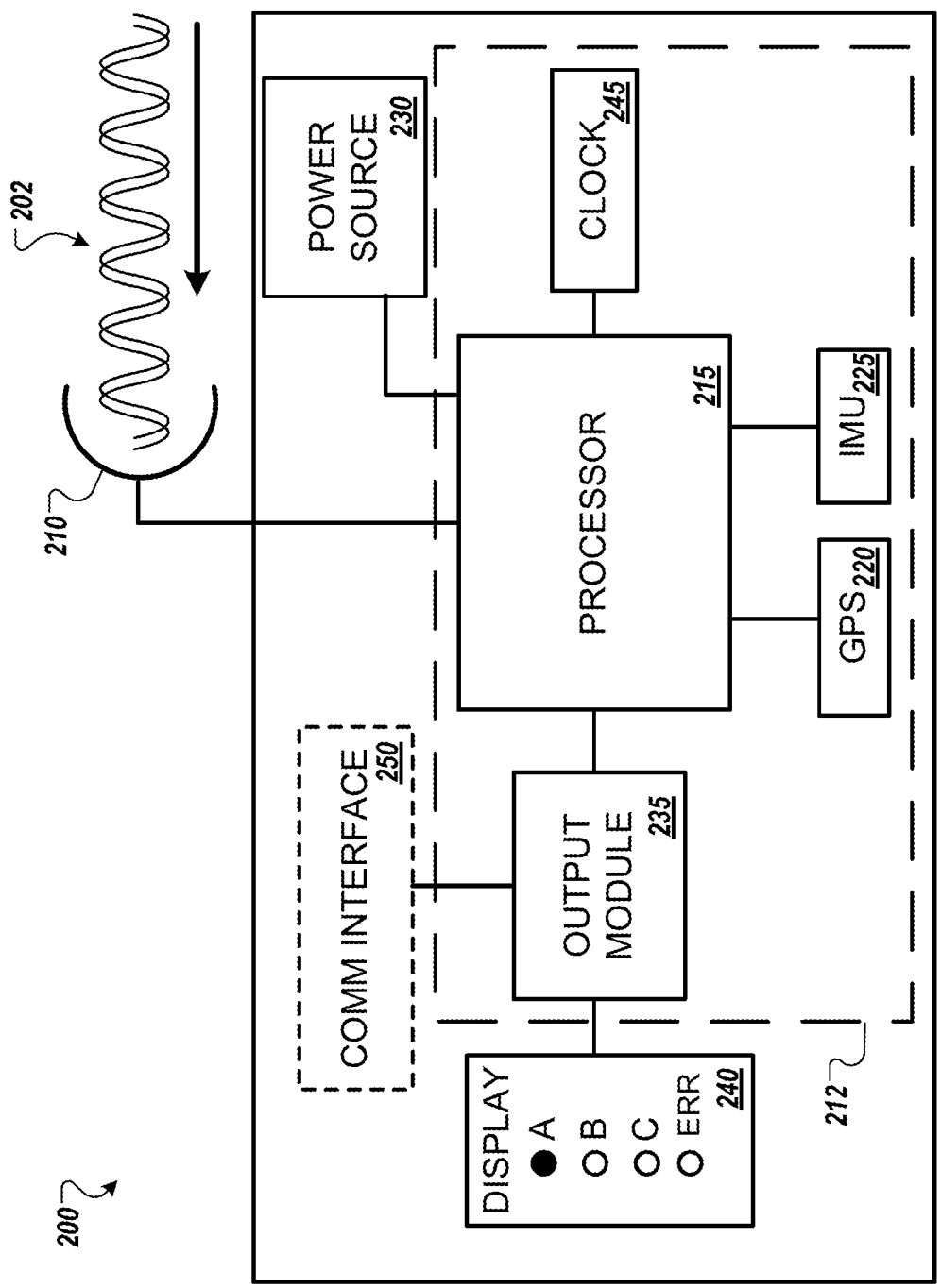
FIG. 2 is a block diagram of an example electrical phase identifier.

FIG. 2 is a block diagram of an example electrical phase identifier 200. The phase identifier 200 can include one or more detectors 210, a control system 212, and a power source 230. The control system 212 can include a processor 215, a GPS 220, an inertial measurement unit (IMU) 225 (e.g., an accelerometer), an output module 235, a display 240, and a clock 245. The example phase identifier 200 can also include a communications interface 250.

The electrical phase identifier 200 detects emissions from a load on an electrical distribution system. The phase identifier 200 has one or more detectors 210 that collect various emissions. The detectors can be, for example, electric field detectors, magnetic field detectors, infrared energy detectors, ultraviolet energy detectors, and visible light detectors. Upon detection of one or more emissions, the detectors 210 convert the electromagnetic energy from the emissions 202 into electrical signals.

The detectors 210 send the collected emissions data to the processor 215. The processor receives the signal data for all emissions 202. The processor 215 correlates the signal data to determine a base signal. To determine the base signal, the processor 215 can focus on a dominant one of the detector output signals. For example, if one detector output signal is particularly strong in comparison with other detector output signals such as light flicker signal or magnetic field signal, the processor 215 can select that signal as the base signal.

In other examples, there is a range of characteristics of emissions. The range of characteristics can be a range of phases such that the phases are bounded and so indicate the particular electrical phase they are derived from. When there is a range of characteristics, the signals can be aggregated or superimposed to determine the base signal. The processor 215 can sum the particular sensed excitations for a wide range of electromagnetic fields, including those that obey superposition, because the fields can be shown to be bounded in phase variation.

The processor 215 receives a reference signal synchronized with an AC phase of a multi-phase electrical power distribution system. The reference signal can come from a remote location, such as an electrical grid substation, and can be communicated to the phase identifier 200 through a communications interface 250. In another example, the clock 245 within the phase identifier 105 is previously synchronized with a particular phase of the AC grid. In this example, the phase identifier is self-contained, and does not communicate externally to obtain the reference signal.

The processor 215 compares the base signal derived from the detected emissions 202 to the reference signal. The processor 215 measures the phase difference between the detected emissions 202 and the reference signal. Based on the measured phase difference, the processor 215 identifies the phase of the emissions 202.

FIG. 3A-3D are diagrams showing example phase differences of various emissions, compared to reference signals. In each example in FIG. 3A-3D, the reference signal is synchronized with the "A" phase of an electrical distribution. The source of detected emissions is a load, such as a house, connected to the "A" phase of the electrical distribution system.

Figure 3A:
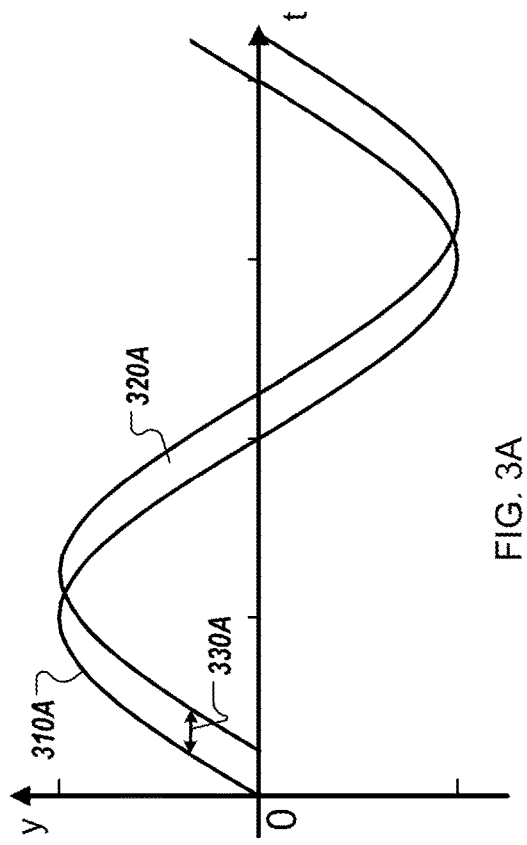
FIG. 3A-3D are diagrams illustrating example phase differences of various emissions.

FIG. 3A shows a sine wave representing the reference signal 310A and a detected emissions signal 320A. The horizontal axis represents time, while the vertical axis represents amplitude. The phase difference 330A is the time delay between the signals. A lagging signal is shifted to the right, while a leading signal is shifted to the left.

The reference signal 310A corresponds to the "A" phase of the electrical grid. The detected emissions signal 320A can represent any electromagnetic field signal emitted from the house 115. For example, the detected emissions signal 320A can represent a magnetic field, ultraviolet radiation, infrared radiation, or visible light radiation.

The processor 215 of the phase identifier measures the phase difference between the reference signal and the emitted signal. Based on the measured phase difference, the phase identifier identifies the electrical phase of the house 115.

In the example of FIG. 3A, the detected emission signal 320A lags the reference signal 310A by less than 90 degrees. Thus, the phase identifier can determine that the detected emissions signal 320A is likely produced by an electrical load of a house that is connected to the reference phase, which is phase "A."

If the detected emissions signal 320A lags the reference signal 310A by more than 120 degrees but less than 240 degrees, the source of the emissions is likely connected to phase "B" of the electrical distribution system. If the detected emissions signal 320A lags the reference signal 310A by more than 240 degrees, the source of the emissions is likely connected to phase "C" of the electrical distribution system.

Figure 3D:
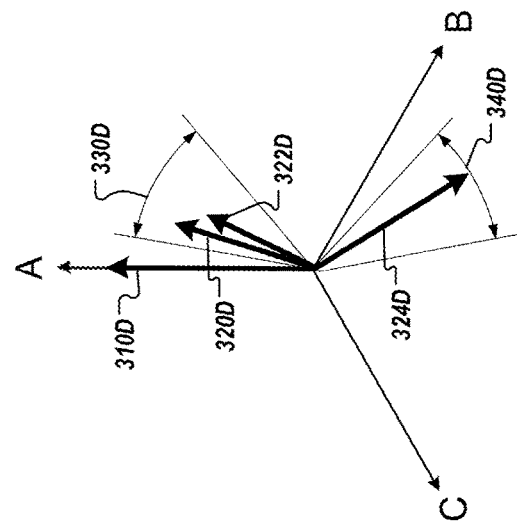
Figure 3C:
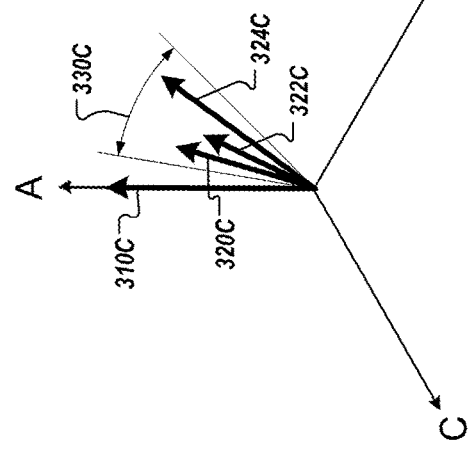
Figure 3B:
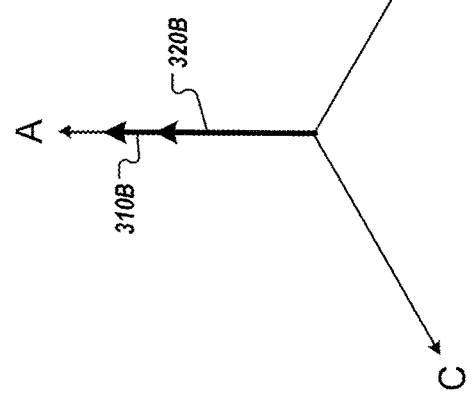

FIGS. 3B, 3C, and 3D are rotating phasor diagrams of AC electrical signals. The three phases of the AC electrical distribution system are represented by vectors A, B, and C, each offset by 120 degrees. The vertical vectors 310B, 310C, and 310D represent the reference signals. Additional vectors on the phasor diagrams represent detected emissions signals. The length of each vector represents the strength, or amplitude, of the signal.

In the example in FIG. 3B, the emissions signal 320B is detected by an electric field detector within a phase identifier, while aimed at a house. The emissions signal 320B from the electric field aligns with the reference signal 310B. The reference signal 310B corresponds to the "A" phase of the electrical distribution system. Therefore, the phase identifier determines that the house is connected to the "A" phase of the electrical distribution system.

The detected emissions may not align exactly with the reference signal or with a particular phase of an electrical distribution system. For each phase, there may be an expected lagging range for detected emissions. For example, a certain detected emission from a house may have an expected lagging range of 10 to 50 degrees from the electrical phase. The expected lagging range may be dependent on the type of emission.

Since the reference signal corresponds with only one phase of the electrical distribution system, the expected lagging ranges will be offset by 120 degrees for each phase. For example, emissions from a house connected to phase "A" may have an expected lagging range of 10 to 50 degrees compared to phase "A." Since the reference signal in this example corresponds with phase "A," the expected lagging range of the emissions signals compared to the reference signal is also 10 to 50 degrees.

As another example, emissions from a house connected to phase "B" may have an expected lagging range of 10 to 50 degrees compared to phase "B." Since the reference signal in this example corresponds with phase "A," the expected lagging range of the emissions signals compared to the reference signal is 130 to 180 degrees. That is, a house connected to phase "B" is expected to emit signals that lag emissions from a house connected to phase "A" by approximately 120 degrees.

In the example in FIG. 3C, three emissions signals 320C, 322C, and 324C are detected by a phase identifier while aimed at a house. The three emissions signals can be detected by, for example, an infrared detector, a magnetic field detector, and a visible light detector within the phase identifier. Of the three detected emissions signals, none align exactly with the reference signal 310C. However, all detected emissions fall within an expected lagging range 330C of the reference signal 310C. The expected lagging range 330C corresponds with loads connected to phase "A." The phase identifier can compare the emissions signals to the reference signal 310C to determine that the phase of the house is "A."

In the example in FIG. 3D, three emissions signals 320D, 322D, and 324D are detected by a phase identifier while aimed at a house. The three emissions signals can be detected by, for example, an infrared detector, a magnetic field detector, and a visible light detector within the phase identifier. Of the three detected emissions signals, none align exactly with the reference signal 310D. Two of the detected emissions signals 320D and 322D fall within an expected lagging range 330D of the reference signal 310D. The expected lagging range 330D corresponds with loads connected to phase "A."

The detected emissions signal 324D falls within an alternate expected lagging range 340D of the reference signal 310D. The expected lagging range 340D corresponds with loads connected to phase "B." To determine the phase of the house in FIG. 3D, the phase identifier can process the three emissions signals 320D, 322D, and 324D in various ways.

In some implementations, the phase identifier can measure the phase difference of each individual emissions signal 320D, 322D, and 324D as compared to the reference signal 310C. If the majority of the emissions signals 320D align with the expected lagging range of a particular phase, the phase identifier can conclude that the house is connected to that phase. For example, since signals 320D and 322D are within the expected lagging range for phase "A," while signal 324 is instead in the expected lagging range for phase "B," the phase identifier can determine that, based on the majority of the emissions signals, the house is connected to phase "A."

In some implementations, the phase identifier can focus on a dominant signal. If one signal is stronger, and therefore larger in amplitude, than other signals, the phase identifier can identify the phase based on comparing only the dominant signal to the reference signal. In the example of FIG. 3D, signal 324D has the largest amplitude. If the phase identifier is programmed to identify the phase based on the dominant signal, the phase identifier can determine that, based on the phase of the strongest signal 324D, the house is connected to phase "B."

In some implementations, the phase identifier can aggregate or superimpose multiple emissions signals. The phase identifier can determine the phase of the load based on the summation of all of the detected signals.

In some implementations, the phase identifier can recognize and ignore outliers. For example, in the example in FIG. 3D, it is possible that signals 320D and 322D represent emissions from the target house, while signal 324D represents an emission from another nearby source. For example, the signal 324D may come from a neighboring house, or from an electrical device that is not connected to the electrical distribution system. The phase identifier can be configured to recognize and disregard outliers so as to reduce the effects of noise and interference.

Referring back to FIG. 2, once the processor 215 identifies the phase of a load, such as the house 115, the processor 215 provides the identified phase to the output module 235. The output module can provide an indication of which power phase of the electrical grid the house 115 is connected through the display 240. The display 240 can be, for example, a digital display screen that can display the letters "A," "B," or "C," according to the identified phase. In another example, the indication can be a set of three LEDs labeled "A," "B," and "C." The LED next to the appropriate letter can illuminate when the phase of the load is identified. Alternatively, the display 240 can be a dial with an indicator that points to either "A," "B," or "C." The display 240 provides an individual user near the source of emissions 202 with an indication of the phase of the source.

The display 240 can include an indication that a signal is not strong enough, or that there is too much noise for the phase identifier to make a phase determination. This indication can be, for example, a written message on a digital display screen, such as "Weak Signal Strength" or "High Noise Level." Alternatively, the indication can be an LED with a label such as "error." These indications can signal to the user for example, that the phase identifier should be moved closer to the source of emissions, or that nearby emissions sources should be shielded.

The output module 235 can communicate externally via the communication interface. The communication interface can be used, for example, to send the identified phase of a load to a remote server or a mobile computing device, e.g., a smartphone, tablet computer, or laptop computer.

The phase identifier 200 includes a GPS 220 and an IMU 225. The GPS 220 determines the geographical location of the phase identifier. The IMU 225 can be used for gimbal details to correct for specific target location. The GPS 220 and IMU 225 together can determine the location, orientation, and/or speed of the phase identifier 200. In some implementations, the GPS 220 and IMU 225 can communicate the location, orientation, and/or speed information to a vehicle on which the phase identifier 200 is mounted. The vehicle can use the information from the GPS 220 and IMU 225 to navigate near loads and orient the detectors 210 of the phase identifier 200.

The phase identifier 200 also includes a power source 230. The power source 230 can be internal, such a battery or solar cell. In some implementations, the phase identifier 200 can use external power through a power cord that is plugged into a power outlet. For example, the phase identifier 200 can obtain external power through a power cord connected to a vehicle.

Figure 4:
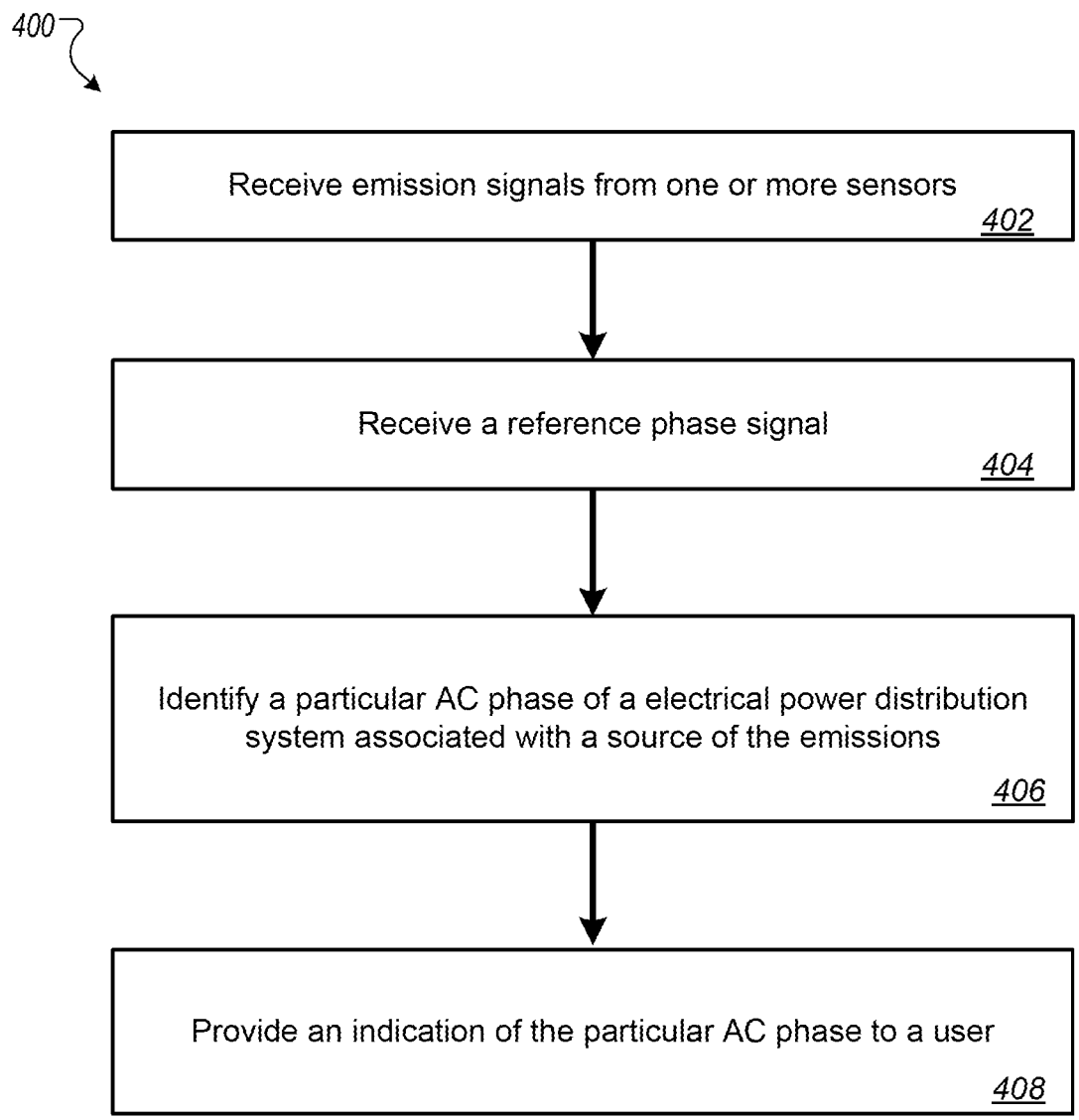
FIG. 4 is a flow diagram that illustrates example processes for identifying the phase of emissions.

FIG. 4 depicts a flowchart of an example process 400 for identifying the phase of emissions. In some implementations, the process 400 can be provided as one or more computer-executable programs executed using one or more processors or microcontrollers. In some examples, the process 400 is executed by a phase identification device such as phase identifier 200 of FIG. 2.

The phase identifier receives emission signals from one or more sensors (402). The sensors can be, for example, electric field sensors, magnetic field sensors, ultraviolet sensors, infrared sensors, and/or visible light sensors. The phase identifier can process the emissions signals by, for example, aggregating multiple emissions signals and/or identifying a dominant signal.

The phase identifier secondly receives a reference phase signal that is synchronized with an alternating current (AC) phase of a multi-phase electrical power distribution system (404). The reference signal can come from a component within the phase identifier, such as a previously synchronized reference clock, from a remote location, such as a server located at a grid substation, and/or from any power source of known phase.

The phase identifier identifies, based on comparing respective phases of the output signals to the reference phase, a particular AC phase of the multi-phase electrical power distribution system associated with a source of the emissions (406). The phase identifier can determine that the source of the emissions is fed from phase "A," "B," or "C" of the electrical distribution system.

The phase identifier provides an indication of the particular AC phase to a user (408). The indication can be provided, for example, on a digital display screen or via LED light indications. The identified phase can also be communicated to a remote server to be saved and referenced for various purposes, such as mapping the electrical distribution system and tracking phase imbalance.

Figure 5:
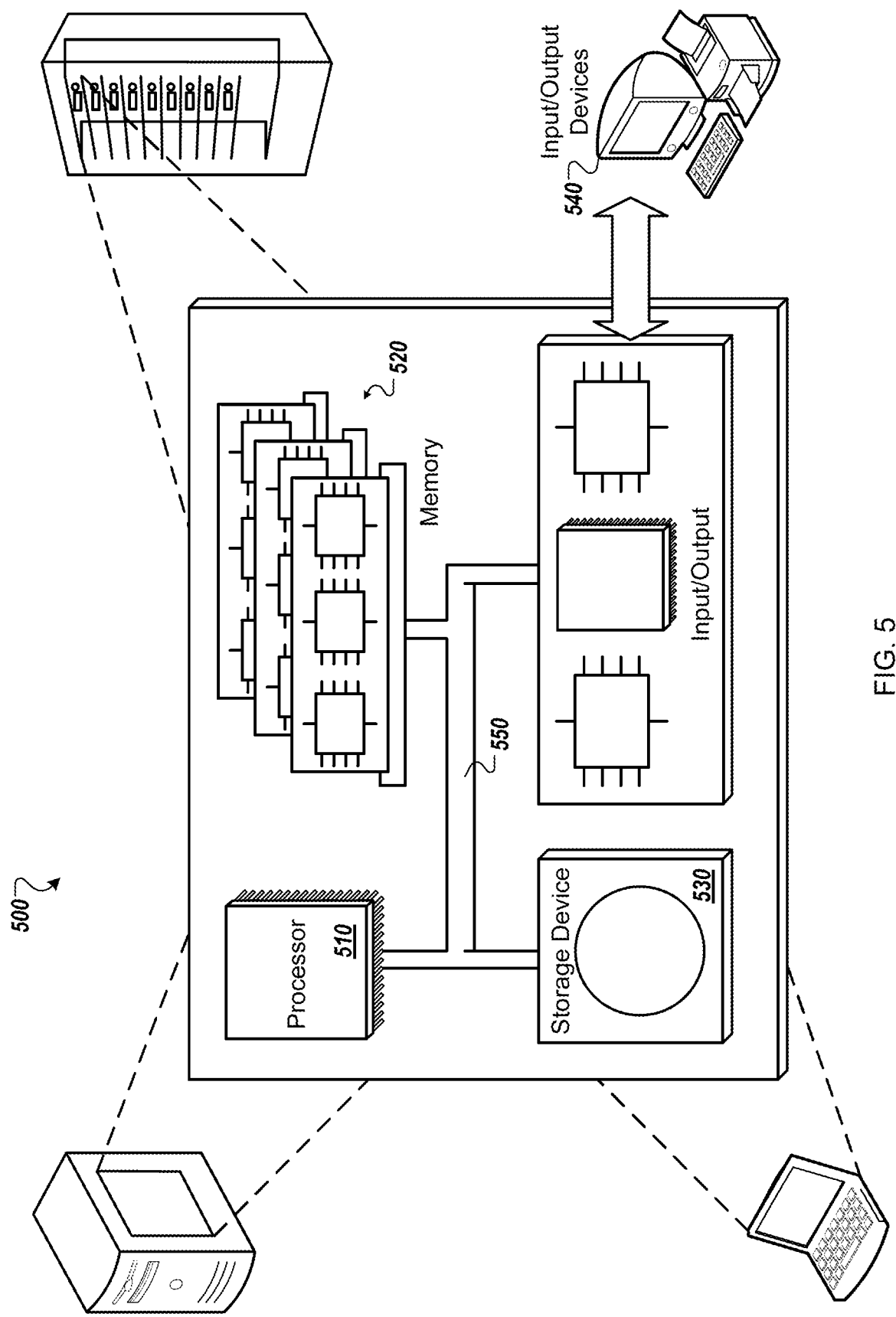
FIG. 5 depicts a schematic diagram of a computer system that may be applied to any of the computer-implemented methods and other techniques described herein.

FIG. 5 is a schematic diagram of a computer system 500. The system 500 can be used to carry out the operations described in association with any of the computer-implemented methods described previously, according to some implementations. In some implementations, computing systems and devices and the functional operations described in this specification can be implemented in digital electronic circuitry, in tangibly-embodied computer software or firmware, in computer hardware, including the structures disclosed in this specification (e.g., system 500) and their structural equivalents, or in combinations of one or more of them. The system 500 is intended to include various forms of digital computers, such as laptops, desktops, workstations, personal digital assistants, servers, blade servers, mainframes, and other appropriate computers, including vehicles installed on base units or pod units of modular vehicles. The system 500 can also include mobile devices, such as personal digital assistants, cellular telephones, smartphones, and other similar computing devices. Additionally, the system can include portable storage media, such as, Universal Serial Bus (USB) flash drives. For example, the USB flash drives may store operating systems and other applications. The USB flash drives can include input/output components, such as a wireless transducer or USB connector that may be inserted into a USB port of another computing device.

The system 500 includes a processor 510, a memory 520, a storage device 530, and an input/output device 540. Each of the components 510, 520, 530, and 540 are interconnected using a system bus 550. The processor 510 is capable of processing instructions for execution within the system 500. The processor may be designed using any of a number of architectures. For example, the processor 510 may be a CISC (Complex Instruction Set Computers) processor, a RISC (Reduced Instruction Set Computer) processor, or a MISC (Minimal Instruction Set Computer) processor.

In one implementation, the processor 510 is a single-threaded processor. In another implementation, the processor 510 is a multi-threaded processor. The processor 510 is capable of processing instructions stored in the memory 520 or on the storage device 530 to display graphical information for a user interface on the input/output device 540.

The memory 520 stores information within the system 500. In one implementation, the memory 520 is a computer-readable medium. In one implementation, the memory 520 is a volatile memory unit. In another implementation, the memory 520 is a non-volatile memory unit.

The storage device 530 is capable of providing mass storage for the system 500. In one implementation, the storage device 530 is a computer-readable medium. In various different implementations, the storage device 530 may be a floppy disk device, a hard disk device, an optical disk device, a tape device, or a solid state device.

The input/output device 540 provides input/output operations for the system 500. In one implementation, the input/output device 540 includes a keyboard and/or pointing device. In another implementation, the input/output device 540 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, e.g., in a machine-readable storage device for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer. Additionally, such activities can be implemented via touchscreen flat-panel displays and other appropriate mechanisms.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include a local area network ("LAN"), a wide area network ("WAN"), peer-to-peer networks (having ad-hoc or static members), grid computing infrastructures, and the Internet.

The computer system can include clients and servers. A client and server are generally remote from each other and typically interact through a network, such as the described one. The relationship of client and server arises by virtue of computer programs running on the respective computers and having a client-server relationship to each other.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

The invention claimed is:

1. An electrical phase identification device comprising:
   a sensor configured to detect an electromagnetic emission; and
   a control system coupled to the sensor, the control system comprising one or more processors and a data store coupled to the one or more processors having instructions stored thereon which, when executed by the one or more processors, causes the one or more processors to perform operations comprising:
   obtaining a reference signal;
   obtaining an output signal from the sensor, the output signal representative of the electromagnetic emission detected by the sensor;
   identifying, based on comparing the output signal to the reference signal, an electrical phase associated with a source of the electromagnetic emission; and
   outputting an indication of the electrical phase.

2. The device of claim 1, wherein comparing the output signal to the reference signal comprises determining a first phase offset between the output signal and the reference signal.

3. The device of claim 2, wherein identifying the electrical phase associated with the source of the electromagnetic emission comprises:
   determining a second phase offset between the reference signal and an alternating current (AC) phase of a multi-phase electrical power distribution system; and
   determining the electrical phase associated with the source of the electromagnetic emission based on (i) the first phase offset between the output signal and the reference signal and (ii) the second phase offset between the reference signal and the AC phase of the multi-phase electrical power distribution system.

4. The device of claim 1, wherein the reference signal comprises a global positioning system clock signal.

5. The device of claim 1, wherein the sensor is configured to detect the electromagnetic emission from a position that is remote from the source of the electromagnetic emission.

6. The device of claim 1, wherein the sensor and the control system are enclosed in a portable housing.

7. The device of claim 1, wherein identifying the electrical phase associated with the source of the electromagnetic emission comprises identifying a particular AC phase of a multi-phase electrical power distribution system.

8. The device of claim 1, wherein identifying the electrical phase associated with the source of the electromagnetic emission comprises determining that a phase of the output signal from the sensor is within an expected lagging range from the reference signal.

9. The device of claim 1, wherein outputting the indication of the electrical phase comprises providing an indication of the electrical phase to a display of the device.

10. The device of claim 1, wherein outputting the indication of the electrical phase comprises transmitting the indication of the electrical phase to a server system.

11. The device of claim 1, wherein:
   the sensor comprises a first sensor configured to detect a first type of electromagnetic emission and generate a first output signal representative of the electromagnetic emission detected by the first sensor, and
   the device further comprises a second sensor configured to detect a second type of electromagnetic emission and generate a second output signal representative of the electromagnetic emission detected by the second sensor.

12. The device of claim 11, the operations comprising:
obtaining the second output signal from the second sensor; and
identifying the second output signal as a dominant signal over the first output signal,
wherein comparing the output signal to the reference signal comprises comparing the second output signal with the reference signal based on identifying the second output signal as a dominant signal over the first output signal.

13. The device of claim 11, the operations comprising:
obtaining the second output signal from the second sensor;
determining that a phase of the first output signal falls outside of an expected lagging range from the reference signal;
determining that a phase of the second output signal falls within the expected lagging range from the reference signal; and
based on determining that the phase of the first output signal falls outside of the expected lagging range from the reference signal, and that the phase of the second output signal falls within the expected lagging range from the reference signal, identifying the first output signal as an outlier signal,
wherein comparing the output signal to the reference signal comprises:
comparing the second output signal to the reference signal; and
excluding the first output signal from comparison with the reference signal based on identifying the first output signal as an outlier signal.

14. The device of claim 11, the operations comprising:
combining the first output signal and the second output signal into a combined output signal,
wherein comparing the output signal to the reference signal comprises comparing the combined output signal to the reference signal.

15. The device of claim 11, wherein the first sensor is an electric field sensor, and wherein the second sensor is one of a magnetic field sensor, an infrared sensor, a visible light sensor, or an ultraviolet light sensor.

16. The electrical phase identification device of claim 1, further comprising a second sensor configured to detect a second type of electromagnetic emission, wherein the second sensor is an infrared sensor, a visible light sensor, or an ultraviolet light sensor;
wherein the sensor is a first sensor configured to configured to detect a first type of electromagnetic emission, wherein the first sensor is an electric field sensor or a magnetic field sensor,
wherein the reference signal is synchronized with an alternating current (AC) phase of a multi-phase electrical power distribution system,
wherein the output signal is a first output signal representative of the first type of electromagnetic emission detected by the first sensor,
wherein the operations further comprise obtaining an second output signal from the second sensor, the second output signal representative of the second type of electromagnetic emission detected by the second sensor, and
wherein identifying the electrical phase comprises identifying, based on comparing respective phases of the first and second output signals to the reference signal, a particular AC phase of the multi-phase electrical power distribution system associated with a source of the first and second types of electromagnetic emissions.

17. A phase detection method executed by one or more processors, the method comprising:
obtaining a reference signal;
obtaining an output signal from a sensor, the output signal representative of an electromagnetic emission detected by the sensor;
identifying, based on comparing the output signal to the reference signal, an electrical phase associated with a source of the electromagnetic emission; and
outputting an indication of the electrical phase.

18. The method of claim 17, wherein comparing the output signal to the reference signal comprises determining a first phase offset between the output signal and the reference signal.

19. The method of claim 18, wherein identifying the electrical phase associated with the source of the electromagnetic emission comprises:
determining a second phase offset between the reference signal and an alternating current (AC) phase of a multi-phase electrical power distribution system; and
determining the electrical phase associated with the source of the electromagnetic emission based on (i) the first phase offset between the output signal and the reference signal and (ii) the second phase offset between the reference signal and the AC phase of the multi-phase electrical power distribution system.

20. The method of claim 17, wherein the reference signal comprises a global positioning system clock signal.

21. The method of claim 17, wherein the sensor is a first sensor comprising an electric field sensor or a magnetic field sensor configured to detect a first type of electromagnetic emission,
wherein obtaining the output signal from the sensor comprises obtaining a first output signal from the first sensor, the method further comprising:
obtaining a second output signal from a second sensor, wherein:
the second sensor comprises an infrared sensor, a visible light sensor, or an ultraviolet light sensor and is configured to detect a second type of electromagnetic emission, and
the second output signal is representative of the electromagnetic emission detected by the second sensor; and
identifying, based on comparing the first output signal and the second output signal to the reference signal, the electrical phase associated with the source of the electromagnetic emissions.

22. A non-transitory computer readable storage medium storing instructions that, when executed by at least one processor, cause the at least one processor to perform operations comprising:
obtaining a reference signal;
obtaining an output signal from a sensor, the output signal representative of an electromagnetic emission detected by the sensor;
identifying, based on comparing the output signal to the reference signal, an electrical phase associated with a source of the electromagnetic emission; and
outputting an indication of the electrical phase.

23. The non-transitory computer readable medium of claim 22, wherein the sensor is a first sensor comprising an electric field sensor or a magnetic field sensor configured to detect a first type of electromagnetic emission, wherein obtaining the output signal from the sensor comprises obtaining a first output signal from the first sensor, the operations comprising:
obtaining a second output signal from a second sensor, wherein:
the second sensor comprises an infrared sensor, a visible light sensor, or an ultraviolet light sensor and is configured to detect a second type of electromagnetic emission, and
the second output signal is representative of the electromagnetic emission detected by the second sensor; and
identifying, based on comparing the first output signal and the second output signal to the reference signal, the electrical phase associated with the source of the electromagnetic emissions.

\* \* \* \* \*